United States Patent [19]
Rzedzian

[11] Patent Number: 5,481,191
[45] Date of Patent: Jan. 2, 1996

[54] SHIELDED GRADIENT COIL FOR NUCLEAR MAGNETIC RESONANCE IMAGING

[75] Inventor: Richard Rzedzian, Lexington, Mass.

[73] Assignee: Advanced NMR Systems, Inc., Wilmington, Mass.

[21] Appl. No.: 242,706

[22] Filed: May 13, 1994

Related U.S. Application Data

[63] Continuation of Ser. No. 133,733, Oct. 17, 1993, abandoned, which is a continuation of Ser. No. 921,411, Jul. 23, 1992, abandoned, which is a continuation of Ser. No. 545,888, Jun. 29, 1990, abandoned.

[51] Int. Cl.$^6$ ........................................... G01V 3/00
[52] U.S. Cl. ................................... 324/318; 20/606
[58] Field of Search ........................ 324/307, 313, 324/318, 319, 320, 322, 228, 232, 260; 335/301; 128/653.5; 29/606

[56] References Cited

U.S. PATENT DOCUMENTS

| | | | |
|---|---|---|---|
| 3,946,349 | 3/1976 | Haldeman, III | 336/62 |
| 4,472,662 | 9/1984 | Freed | 315/399 |
| 4,509,030 | 4/1985 | Vermilyea | 324/320 |
| 4,549,042 | 10/1985 | Akiba et al. | 324/260 |
| 4,634,975 | 1/1987 | Eccleston et al. | 324/232 |
| 4,642,569 | 2/1987 | Hayes et al. | 324/318 |
| 4,646,024 | 2/1987 | Schenck et al. | 324/318 |
| 4,694,255 | 9/1987 | Hayes | 324/318 |
| 4,733,189 | 3/1988 | Punchard et al. | 324/318 |
| 4,737,716 | 4/1988 | Roemer et al. | 324/319 |
| 4,794,338 | 12/1988 | Roemer et al. | 324/318 |
| 4,906,934 | 3/1990 | Haragashira | 324/319 |
| 4,954,781 | 9/1990 | Hirata | 324/318 |

FOREIGN PATENT DOCUMENTS

| | | |
|---|---|---|
| 0304126 | 2/1989 | European Pat. Off. . |
| 2170957 | 8/1986 | United Kingdom . |
| 2229820 | 10/1990 | United Kingdom . |

OTHER PUBLICATIONS

Mansfield, P. et al., "Multishield Active Magnetic Screening of Coil Structures in NMR", Journal of Magnetic Resonance, vol. 72, (1987), pp. 211–223.

Turner, R. et al., "Passive Screening of Switched Magnetic Field Gradients", The Institute Of Physics Jan. 16, 1986, pp. 876–879.

Primary Examiner—Louis M. Arana
Attorney, Agent, or Firm—Fish & Richardson

[57] ABSTRACT

A unitary, generally cylindrical member supports both the primary and shielding coils. By supporting both coils on a unitary member it is possible to take advantage of the antiphase relationship between the primary and shielding coils and thereby reduce the acoustic noise generated by the gradient coil assembly. The unitary member can be formed by starting with a mandrel to which the primary coil is applied, and then successively adding layers each having a cylindrical outer surface aligned with the same longitudinal axis. Each new cylindrical surface is formed by adding material and then removing some of the material while rotating the member about the longitudinal axis (e.g., turning on a lathe, or passing a blade past a still liquid skim coat). Additional primary and shielding coils are applied after each new aligned, cylindrical surface is formed. One or more correction coils are located outside of the shielding coils to cancel any gradient field present there as the result of misalignment between the primary and shielding coils. Litz wire is used in the primary and shielding coils to reduce coil resistance.

1 Claim, 5 Drawing Sheets

SHIELDED GRADIENT COIL FOR NUCLEAR MAGNETIC RESONANCE IMAGING

This is a continuation of application Ser. No. 08/133,733, filed Oct. 7, 1993, now abandoned; which is a continuation of Ser. No. 07/921,411, filed Jul. 23, 1992, now abandoned; which is a continuation of Ser. No. 07/545,888, filed Jun. 29, 1990, now abandoned.

BACKGROUND OF THE INVENTION

This invention relates to gradient coils in nuclear magnetic resonance imaging systems.

Nuclear magnetic resonance (NMR) systems may be used as medical diagnostic tools. Generally, they consist of a region that holds the patient or sample surrounded by a set of coils. The outermost coil is often a superconducting DC coil which provides a strong, constant magnetic field that polarizes the nuclei in the molecules of the sample or the patient's body. A smaller RF coil sits concentrically within the DC coil, and generates a time-varying RF field that excites the nuclei and detects their response to this excitation. A coil assembly, generally referred to as the "gradient coil", occupies the space between the above coils and generates a time-varying spatially dependent audio frequency magnetic field (usually a linear gradient field) which causes the response frequency of the nuclei to depend on their positions within the field. This imparted spatial information allows the generation of an image of the areas excited and detected by the RF coil.

Such a gradient coil assembly usually consists of a set of three primary coils (X, Y and Z) which may each be manufactured by winding a pattern of conductors on the surface of a cylinder. Each of these coils may be shielded with another pattern of conductors wound on another cylindrical surface which surrounds the coils. Coils of this type are presented in U.S. Pat. Nos. 4,737,716 and 4,794,338 (incorporated by reference), respectively entitled "Self-Shielded Gradient Coils for Nuclear Magnetic Resonance Imaging" and "Balanced Self-Shielded Gradient Coils", both of Roemer et al.

Gradient coils, because they operate at audio frequencies, can be the source of high levels of acoustic noise. This is particularly true for coils used in high speed imaging, as higher frequencies and higher currents are used.

It is also known to use Litz wire in transformers and coils as it reduces skin effect conduction and thus exhibits decreased resistance for a given conductor diameter. U.S. Pat. No. 4,549,042 entitled "Litz Wire for Decreasing Skin Effect at High Frequency" of Akiba discusses this effect.

SUMMARY OF THE INVENTION

The invention features, in a first aspect, a unitary, generally cylindrical member on which the primary and shielding coils are supported (e.g., the primary coil on the interior surface and the shielding coil on the exterior surface). By supporting both coils on a unitary member it is possible to take advantage of the antiphase relationship between the primary and shielding coil currents and thereby reduce the acoustic noise generated by the gradient coil assembly. The unitary member need not be entirely solid, but could include voids, so long as it is sufficiently stiff and/or massive to reduce acoustic noise.

In preferred embodiments, the unitary member is formed by starting with a mandrel to which the primary coil is applied, and then successively adding layers each having a cylindrical outer surface aligned with the same longitudinal axis. Each new cylindrical surface is formed by adding material and then removing some of the material while rotating the member about the longitudinal axis (e.g., turning on a lathe, or passing a blade past a still liquid skim coat). Additional primary or shielding coils are applied after each new aligned, cylindrical surface is formed.

In still other preferred embodiments, the unitary member is formed by starting with a cylinder, and adhering the primary coil to the interior of the cylinder and the shielding coil to the exterior.

In a second aspect, the invention features using one or more correction coils located outside of the shielding coils to achieve substantial cancellation of any magnetic field present there as the result of misalignment between the primary and shielding coils.

In a third aspect, the invention features the use of Litz wire in one or more of the primary coils (and preferably also the shielding coils).

The gradient coil assembly of the invention has the advantage of reduced audio noise as the primary and the shield coil windings are both supported on the same unitary member, thus reducing vibration. The currents flow through the coil and shield in an anti-phase fashion and thus their associated magneto-motive forces tend to cancel if appropriately coupled by the unitary member. The mass and stiffness added to the assembly by the unitary member also contributes to reducing the amplitude of audible noise.

The coil assembly of the invention is also aligned with a high degree of precision. Correction coils may compensate for any remaining misalignment of the gradient coil assembly or the main magnet, and may be retro-fitted on existing systems.

The use of Litz wire in the gradient coils of the invention not only provides the advantages of reduced skin effect within the conductors, but also provides advantages due to reduced eddy currents and proximity effect caused by adjacent conductors and adjacent coil layers. These reductions in skin effect, proximity effect, and induced eddy currents lead to lower coil resistance which, in turn, leads to lower power consumption and cooling requirements. The lower power consumption can allow the use of less expensive gradient amplifiers. The reduced proximity effect and lower induced eddy currents from adjacent conductors and adjacent coil layers may provide improved imaging quality.

Other features and advantages of the invention will be apparent from the following description of a preferred embodiment and from the claims.

DESCRIPTION OF THE PREFERRED EMBODIMENT

Figure 1:
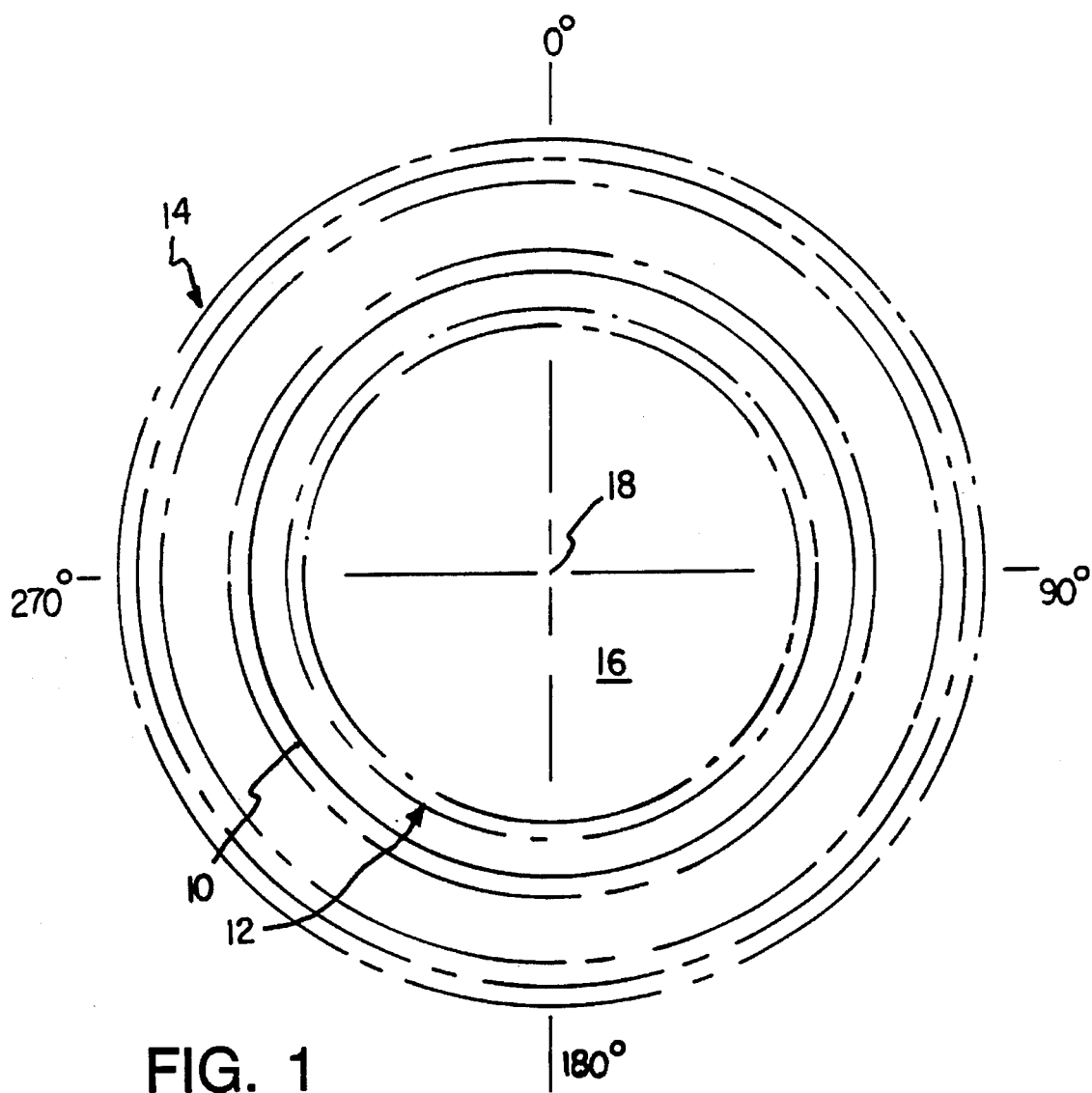
FIG. 1 is a cross-section of an NMR coil apparatus.

Referring to FIG. 1, a diagnostic NMR apparatus includes a cavity 16 for examining a patient, surrounded by a cylindrical RF coil 12. This coil 12 alternatively provides an RF field that excites the nuclear magnetic resonance phenomenon in the nuclei of the molecules of the patient's body and acts as a detector to detect the response of the nuclei to their overall excitation by the NMR apparatus. The RF coil is surrounded by an RF shield 10. A detailed description of this shield and its operation may be found in a co-pending application entitled "Split Shield for Magnetic Resonance Imaging" and assigned to the same assignee.

The RF shield is, in turn, surrounded by a gradient coil assembly 14. The gradient coil assembly is made up of a series of coils which generate audio frequency gradient fields that, taken together, allow spatial resolution of the NMR phenomenon within the cavity. These gradient coils operate at frequencies up to 7 kHz. A further coil (not shown), known as the main magnet, surrounds the gradient coil assembly. The RF coil, shield, gradient coil assembly, and main magnet are concentrically arranged around the center of the NMR apparatus 18.

Figure 2:
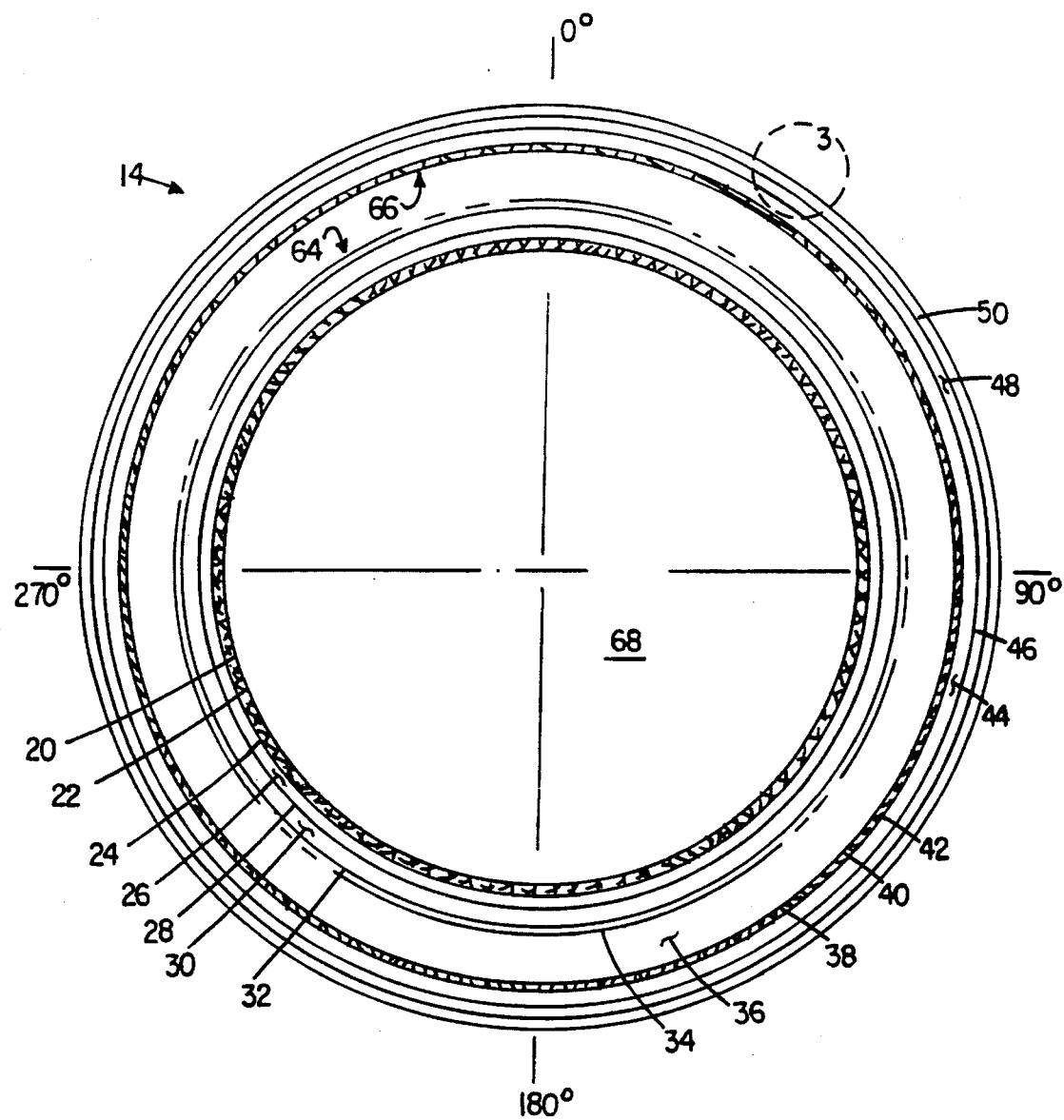
FIG. 2 is a cross-section of an NMR gradient coil assembly.
Figure 4:
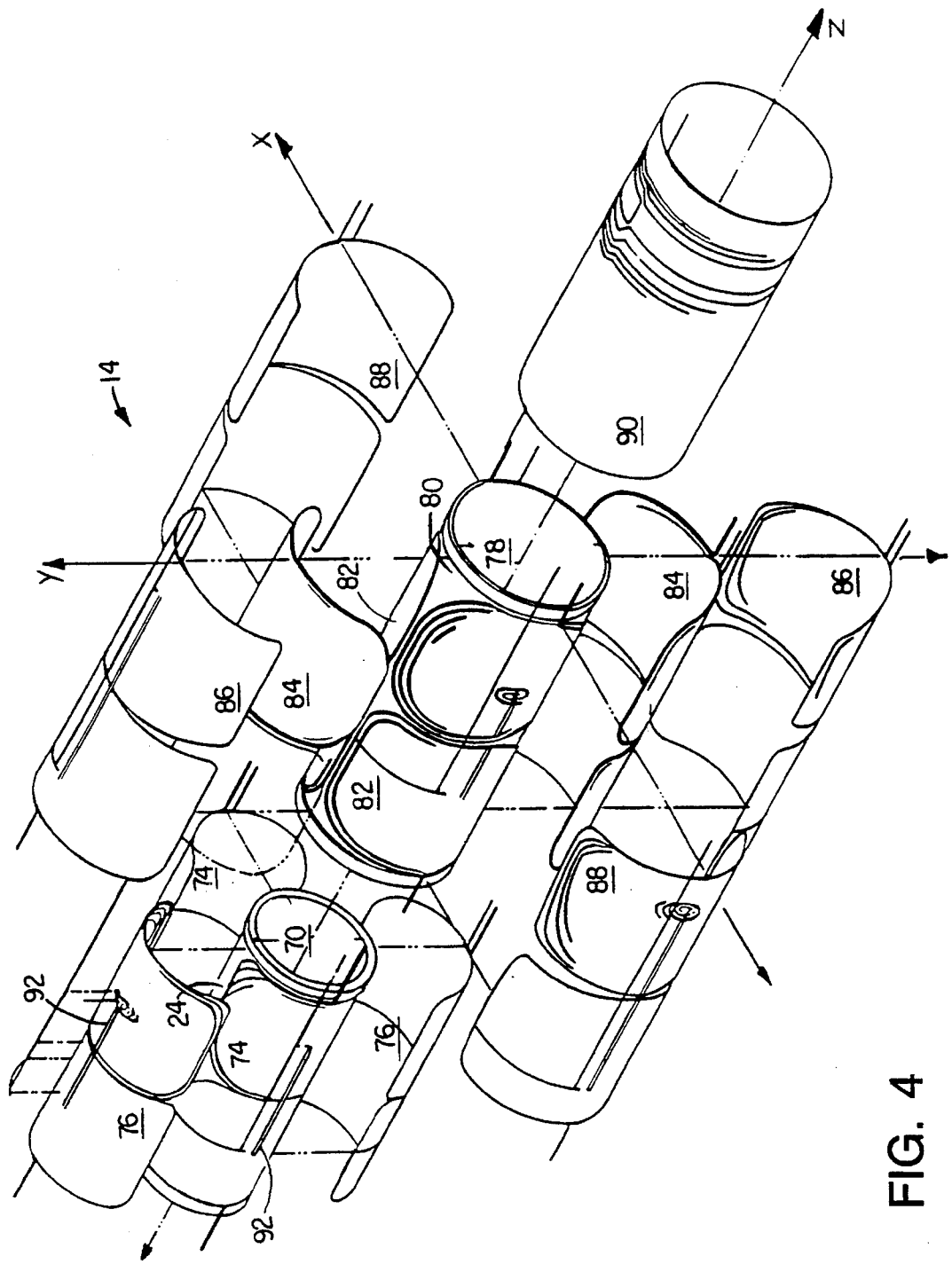
FIG. 4 is a partial exploded view of the NMR gradient coil assembly, showing the X and Y coils and shields removed from their embedded Z counterparts.

Referring to FIGS. 2 and 4, the gradient coil assembly 14 consists of two sets of coils arranged concentrically. The innermost set 64 includes the primary gradient coils, and the outermost set 66 comprises the shield, shim and correction coils.

The inner surface 20 of the gradient coil assembly defines the inside surface of the Z-coil 70. This Z-coil may be wound on a former (not shown) which will remain part of the system or it may be wound on a mandrel 68 that is later removed, as is shown in the figure. The assembly and winding procedure will be discussed in more detail later. The Z-coil is wound as a cylindrical spiral and it provides a magnetic field gradient in the Z-direction within the cavity 16.

The gradient coils in the assembly are wound with Litz wire. The Litz wire used is an 805-strand Litz wire available from New England Electric Wire, of Lisbon, N.H. Litz wire is used in many applications for its reduced resistance at high frequencies, due to a lower skin effect. This is an advantage in that the amplifiers that drive the coils need to deliver less power and consequently may be made less expensively. In addition, the coil produces less heat and consequently requires less cooling. It has also been found that Litz wire has the advantage of reducing proximity effect in the gradient coil assembly.

Proximity effect is the effect of the magnetic field caused by current flowing in one conductor on the current distribution in an adjacent conductor. Reducing the proximity effect between adjacent conductors within a coil decreases the resistance in the coil. Reducing the proximity effect between conductors in separate coils will also decrease the resistance of the coils and, furthermore, may result in reduced imaging distortion, caused by circulating eddy currents in solid conductors.

A current-carrying wire may also induce eddy currents in its neighbors. The use of Litz wire reduces the amount of current which may be induced in an adjacent conductor by fragmenting its cross-section. The reduction of this proximity effect within a coil contributes to a lower resistance of the coil, and the reduction of this effect between separate coils contributes to lower coil resistances and lower imaging distortion. This reduced distortion results in more accurate imaging of the sample or patient.

Figure 5:
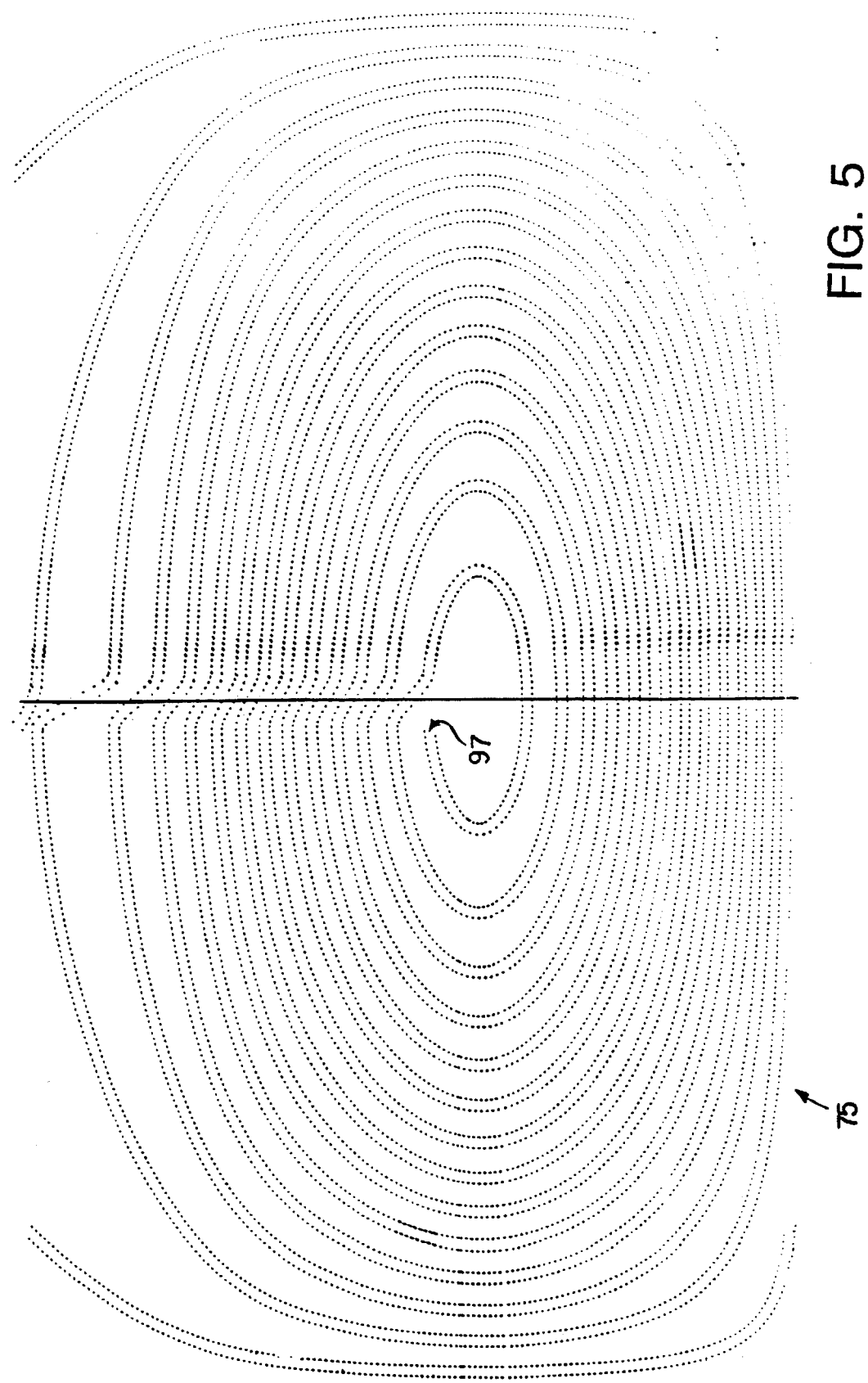
FIG. 5 is a partial winding pattern for the X primary coil.

The manufacturing process begins with the Z-coil being embedded in, and axially surrounded by, an epoxy layer 22 which has an outer surface 24 that serves as an X-coil winding surface. The X-coil 74 includes four generally spirally wound segments 75 (FIG. 5) of wire that are curved to conform to the curvature of the X-coil winding surface 24 (as shown, for example, in U.S. Pat. Nos. 4,737,716 and 4,794,338). The center leads 97 of these segments are connected by bus bars 92. The X-coil provides a linear gradient in the X direction within the cavity 16.

The X-coil is embedded in, and axially surrounded by, a second epoxy layer 26 which has an outer surface 28 on which the Y-coil 76 is wound. The Y-coil is similar to the X-coil, except that it is displaced around the cylinder by 90° with respect to the X-coil. This may be seen in FIG. 4. The Y-coil provides a time-varying linear gradient in the Y direction within the cavity 16.

A third epoxy layer 30 embeds and surrounds the Y-coil and provides a winding surface 32 for coolant tubes 34. These tubes cool the entire assembly. The tubes are surrounded by a wider central epoxy layer 36 which separates the primary coils from the outer coils. It is advantageous to separate the primary and outer coils by a large distance, for it reduces the power requirement of each shielded pair and also provides for a stronger overall gradient within the cavity.

The innermost shield coil is the Z-shield 78, which is wound on the outer surface 38 of the central epoxy layer 36. This shield is similar to the Z-coil, except that it is wound less densely. Its purpose is to provide a magnetic field that cancels that of the Z-coil outside of the gradient coil assembly. This prevents unwanted interaction with the main magnet and other objects outside of the coil.

The X-shield 82 and Y-shield 84 are wound on the surfaces 42, 46 of epoxy layers 40, 44, much as their associated coils were. These coils are also essentially sparser versions of their associated primary coils. It is noted that the order in which the coils are wound within each of the two sets is of little consequence, as long as the shield coils are designed to properly cancel their associated primary coil fields outside of the gradient coil assembly.

Figure 3:
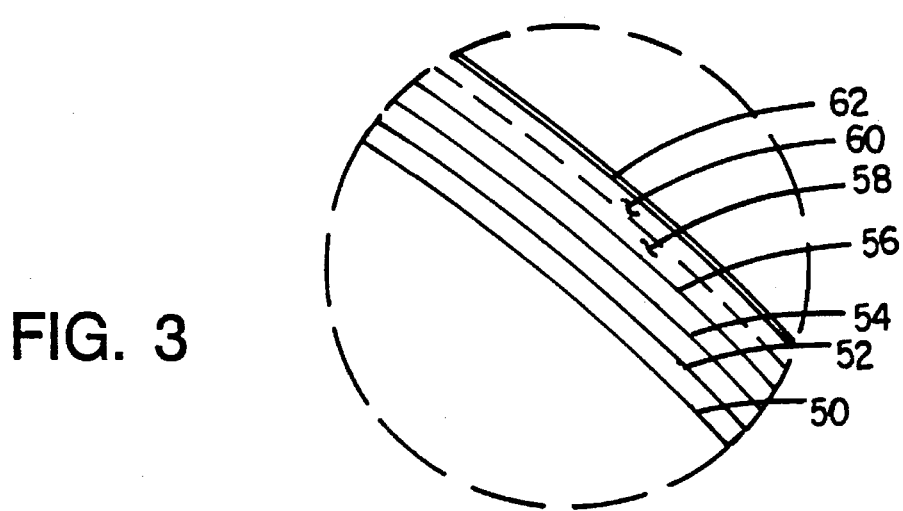
FIG. 3 is a detail of the outer coil layers in the area shown by circle "A" in FIG. 2.

Outside of the shield coils is a set of shim coils which are shown in FIGS. 3 and 4. This set of shim coils includes a Y-shim 86, an X-shim 88, and a Z-shim 90 which are mounted on epoxy layer surfaces 50, 52, 54. These shims are powered with DC current, and allow small adjustments of the static field of the main magnet.

Outside of the shim coils, there is a Z-correction coil 58 (not shown in FIG. 4) which is wound on the outer surface 56 of a penultimate epoxy layer. This coil is provided to compensate for the field generated by any misalignment that may exist between the Z-coil and the Z-shield by generating a correction field which cancels the field due to the misalignment. Similar correction coils may also be provided for X or Y orientations, if needed. Correction coils may not be needed at all if the coils are sufficiently well aligned. If the corrections needed are linear in nature, the shim coils may be used for achieving the corrections.

It should be noted that the addition of correction coils will permit less demanding tolerances in the alignment and/or manufacturing processes, and may thus reduce the cost of achieving acceptable alignment. It should also be noted that this type of correction coil may be retro-fitted to existing systems. The particular configuration of correction coils will depend on the field resulting from the relative mechanical tolerances among the layers of that NMR system.

Figure 6:
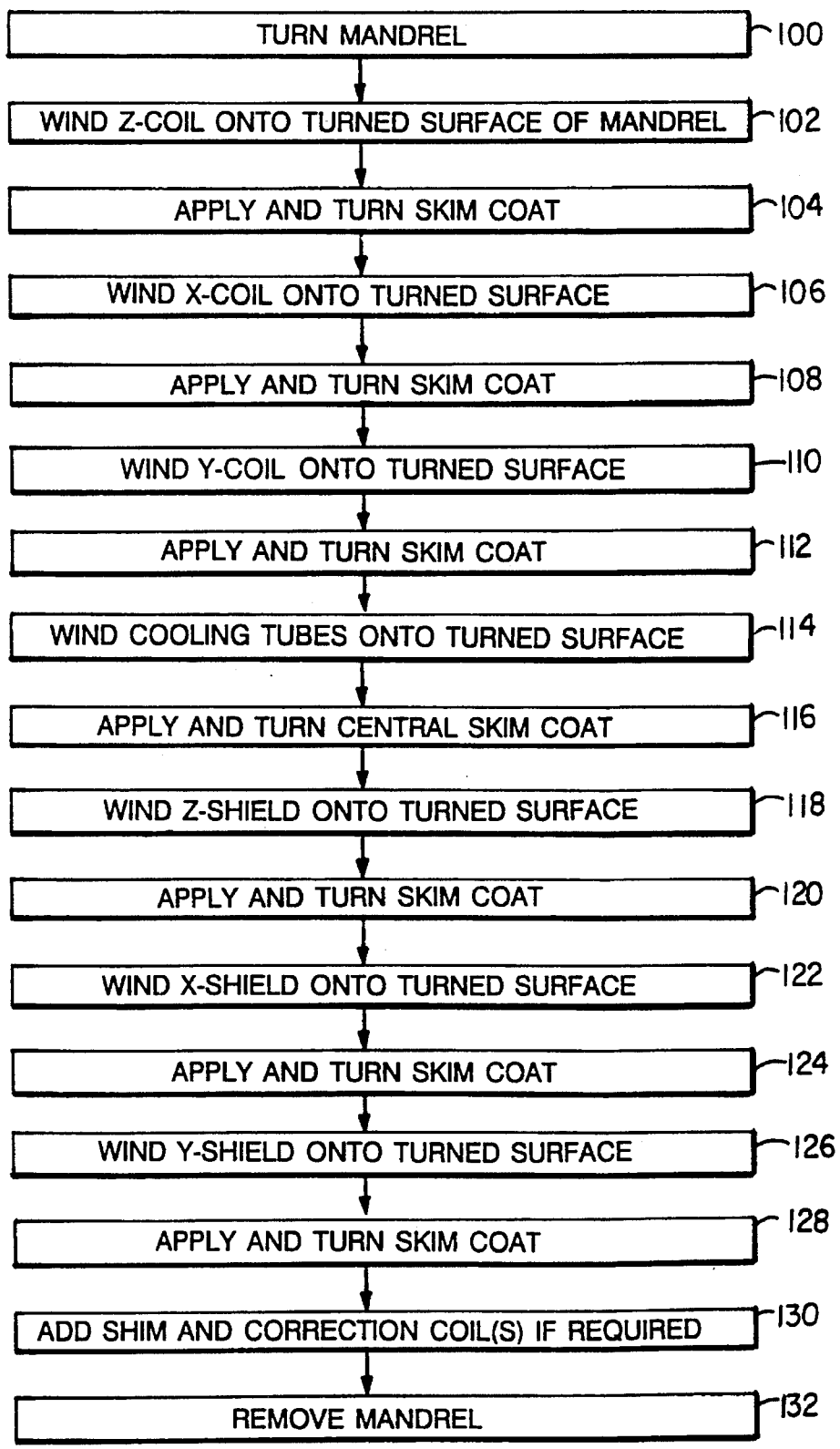
FIG. 6 is a flowchart illustrating steps involved in manufacturing a coil assembly.

These mechanical tolerances may be minimized by manufacturing the coil assembly on a lathe. Referring to FIG. 6, initially, a mandrel 68 is positioned in a lathe and turned 100 to yield a cylindrical mandrel with an outer surface that is aligned with the axis of the lathe. The Z-coil is then wound upon the mandrel and a suitable material, such as an epoxy is added on the outer surface of the Z-coil. The epoxy used should preferably be thixotropic, have a high thermal conductivity, present minimal shrinkage on setting, and be such that it may be cut on a lathe. This epoxy is allowed to set and is then turned 104 in order to produce a second outer surface that is also aligned with the axis of the lathe. The X-coil is then wound 106 on this surface, and the process is repeated for the Y-coil (steps 108–110) and cooling tubes (steps 112–114).

This completes the primary layers. A further layer of epoxy is added on the outside of the cooling tubes which will separate the primary layers and the outer layers. As mentioned earlier, this central layer is wider than the others and is therefore more suited to formation by molding, than it is to simple addition of epoxy. This molding operation is performed by surrounding the partial gradient coil assembly with an essentially cylindrical clam-shell mold, filling it with epoxy (Concresive, an adhesive filler available from Adhesive Engineering, San Carlos, Calif.) used on the other layers, and allowing it to harden. Once the epoxy has hardened, the mold is removed, and the outer surface of the newly formed layer is turned to align it with the axis of the assembly, as were the earlier layers (step 116). It should be noted that this layer can also be formed with voids in it, or it may be formed in separate pieces. This would allow, for example, the use of a reduced amount of epoxy and/or the provision of locations for reinforcement members.

The Z-shield, X-shield, and Y-shield are then built up on the assembly in the same way as were the coils (steps 118–126). Correction and shim coils may also be added in a similar fashion (steps 128–130). A final epoxy layer 60 and a coat of epoxy paint 62 may be added to protect the outside surface of the gradient coil assembly (FIG. 3).

The mandrel is then removed (132), yielding a gradient coil assembly whose alignment between layers depends only on the tolerance of a single lathe and which has misalignment errors that are non-additive. It is noted that no complicated post-construction alignment procedures are needed, as would be necessary when assembling separate primary and outer coil assemblies.

During operation of the gradient coil assembly, acoustic noise is generated due to vibrations caused by the magneto-motive forces developed on the current-carrying wires within the high static magnetic field of the main magnet. Since the coil currents are modulated at audio frequencies, audio frequency sounds are produced. These may be of very high amplitude; in some cases being loud enough to damage the patient's hearing. The fact that the primary layers and the outer layers are held together in one integral piece with a turned central layer 36 reduces the audio noise produced by the coil assembly. This is true because the currents in the shields and coils are in opposing phase with respect to each other, so that their respective magneto-motive forces tend to cancel each other when the shields and coils are coupled together by the stiff and massive cylinder between them.

Other embodiments are within the scope of the following claims.

For example, there are other methods of manufacturing an integral piece that carries the primary coils on the inside and the shielding coils on the outside. E.g., the coils could be wound on separate cylindrical formers and the space between these formers could be filled with a filler. In this method, it is necessary to use a filler which shrinks very little while hardening, or the coil may lose its alignment. Concresive, an adhesive filler available from Adhesive Engineering (San Carlos, Calif.) contains a substantial amount of sand and therefore tends to exhibit little shrinkage, making it a good choice. This sand-filled adhesive could also be used in the earlier-described molding process.

The assembly could also be made by first creating the single piece central cylindrical former. The primary coils are then placed on the inside surface of the former and the shielding coils are placed on the outside of the former. The coils are held to the former with an adhesive, and may be wound upon each other, or separated by layers of turned epoxy as described above. As is the case for a molded central layer, this former can include substantial voids, provided that it is stiff enough and/or massive enough to reduce the noise output of the assembly.

Alternatively, a light former with substantial voids could be used during turning, and the voids could be filled with epoxy thereafter. Jigs could also be used to maintain alignment during turning, and be removed upon hardening of the epoxy.

Instead of building up the central cylinder (on which the primary and shielding coils are supported) by turning successive layers on a lathe, skim coats could be applied and concentric, cylindrical surfaces formed by rotating the cylinder past a blade while the skim coats are still wet. Alternatively, grinding or milling steps could replace turning on a lathe. In each case, however, material is added to the cylinder in such a way as to create a new cylindrical surface concentric with a common axis.

It should also be noted that Litz wire can be used in primary coils which are not shielded. As for the shielded coil of the preferred embodiment, this unshielded coil would have the advantages of reduced skin effect and of reduced interactions among adjacent coils.

What is claimed is:

1. A method of manufacturing a gradient coil assembly for use in magnetic resonance imaging, said method comprising providing a primary coil assembly manufactured by placing a primary coil about a first generally cylindrical surface of a first substrate, said primary coil generating a first magneto-motive force and a spatially varying magnetic field in a region radially inside said first surface when driven with a first pulsed current signal;

positioning a secondary coil assembly assembly radially outside said first coil assembly, said secondary coil assembly being manufactured by placing a shielding coil for said primary coil about a second generally cylindrical surface of a second substrate;

aligning said primary and secondary coil assemblies so that said second surface is substantially coaxial with said first surface, and so that said shielding coil generates a second magneto-motive force in a direction substantially opposed to said first magneto-motive force and thereby substantially cancels said magnetic field in a region radially outside said second surface when driven with a second pulsed current signal that is substantially 180° out-of-phase with respect to said first pulsed current signal;

introducing a curable compound into the annular region between said first and said second substrates to substantially fill said annular region; and curing said compound, said compound being sufficiently stiff and/or massive when cured to mechanically couple said first and said second substrates to substantially cancel said first and said second magneto-motive forces.

* * * * *

UNITED STATES PATENT AND TRADEMARK OFFICE
CERTIFICATE OF CORRECTION

PATENT NO. : 5,481,191
DATED : January 2, 1996
INVENTOR(S) : Richard Rzedzian

It is certified that error appears in the above-indentified patent and that said Letters Patent is hereby corrected as shown below:

Column 6, line 42, delete the second occurrence of "assembly".

Signed and Sealed this

Sixteenth Day of April, 1996

Attest:

BRUCE LEHMAN

Attesting Officer

Commissioner of Patents and Trademarks